United States Patent [19]

Kurihara et al.

[11] Patent Number: 5,206,593

[45] Date of Patent: Apr. 27, 1993

[54] REAL-TIME CONTROL SYSTEM FOR NMR SPECTROMETER

[75] Inventors: Noriaki. Kurihara; Kozo Sato, both of Tokyo, Japan; Gary L. Samuelson, Amesbury; Howard S. Hutchins, Byfield, both of Mass.

[73] Assignee: Joel Ltd., Tokyo, Japan

[21] Appl. No.: 605,997

[22] Filed: Oct. 31, 1990

[51] Int. Cl.$^5$ ............................................. G01R 33/20
[52] U.S. Cl. ..................................... 324/312; 324/318
[58] Field of Search ................... 324/307, 312, 318; 364/140, 143

[56] References Cited

U.S. PATENT DOCUMENTS

| | | | |
|---|---|---|---|
| 4,191,919 | 3/1980 | Haney | 324/312 |
| 4,620,153 | 10/1986 | Hino | 324/312 |
| 4,736,328 | 4/1988 | Vatis et al. | 324/307 |
| 4,764,894 | 8/1988 | Codrington | 324/312 |
| 4,775,835 | 10/1988 | Kikuchi | 324/312 |
| 4,845,613 | 7/1989 | Netter et al. | 324/312 |
| 4,885,538 | 12/1989 | Hoenniger, III et al. | 324/312 |
| 5,068,786 | 11/1991 | Netter et al. | 324/312 |

Primary Examiner—Michael J. Tokar
Assistant Examiner—Raymond Y. Mah
Attorney, Agent, or Firm—Webb, Burden, Ziesenheim & Webb

[57] ABSTRACT

A real-time control system for use with an NMR spectrometer. The control system comprises a control section, a plurality of functional units controlled by the control section, and a bus line connecting the control section with the functional units. Each functional unit has a memory storing event data specifying the conditions of control means such as gates included in the functional unit. The control section has a memory storing timing data and event codes specifying event data. The control section successively produces timing signals and event codes according to the timing data. The timing signals are transmitted to the functional units over the bus. Each functional unit reads event data from its memory according to the incoming event codes and controls its gates according to the event data in synchronism with the timing signals.

1 Claim, 4 Drawing Sheets

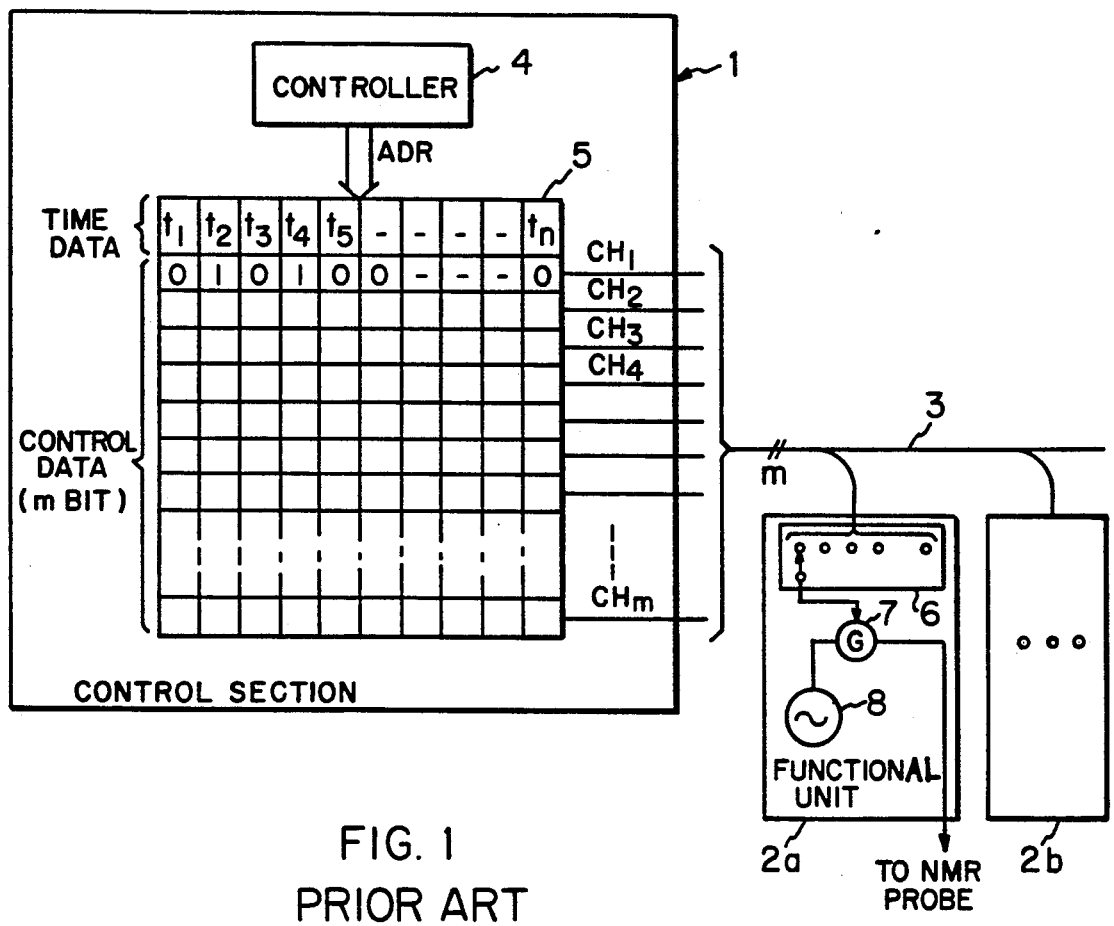
FIG. 1
PRIOR ART
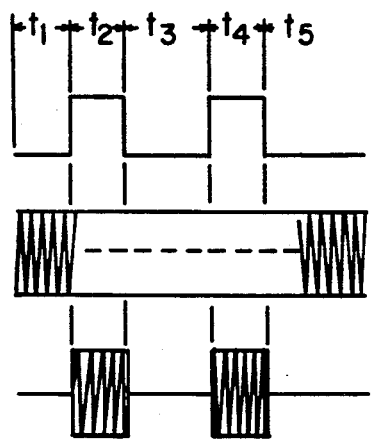
FIG. 2(a)
PRIOR ART
FIG. 2(b)
PRIOR ART
FIG. 2(c)
PRIOR ART

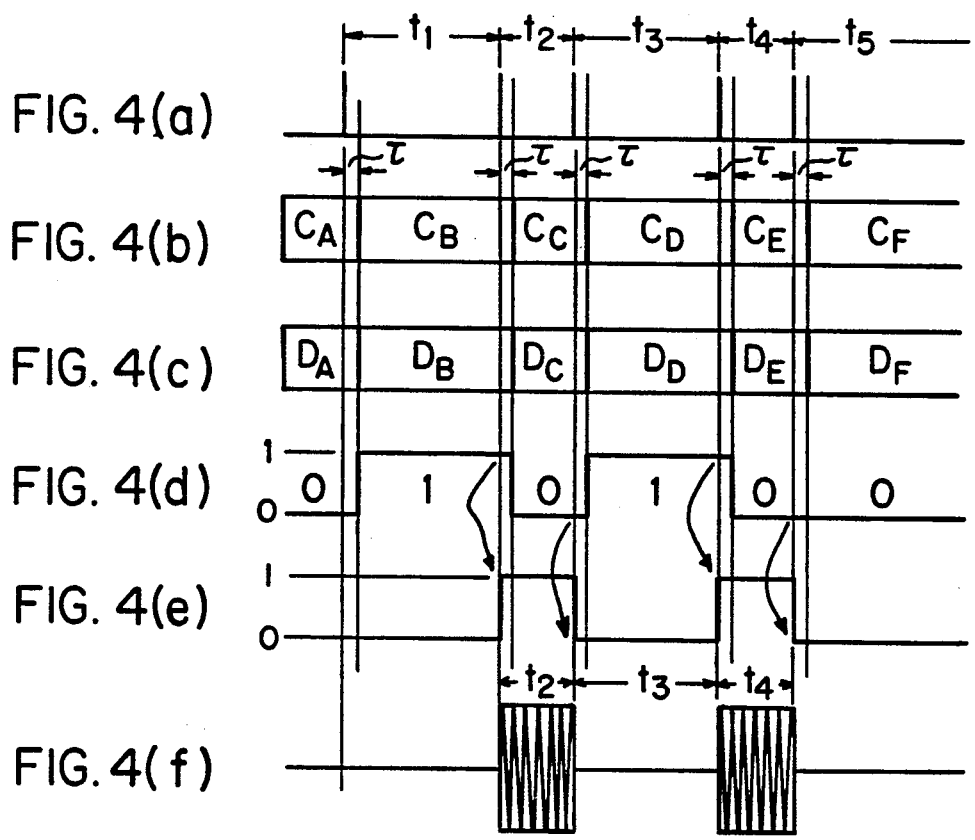
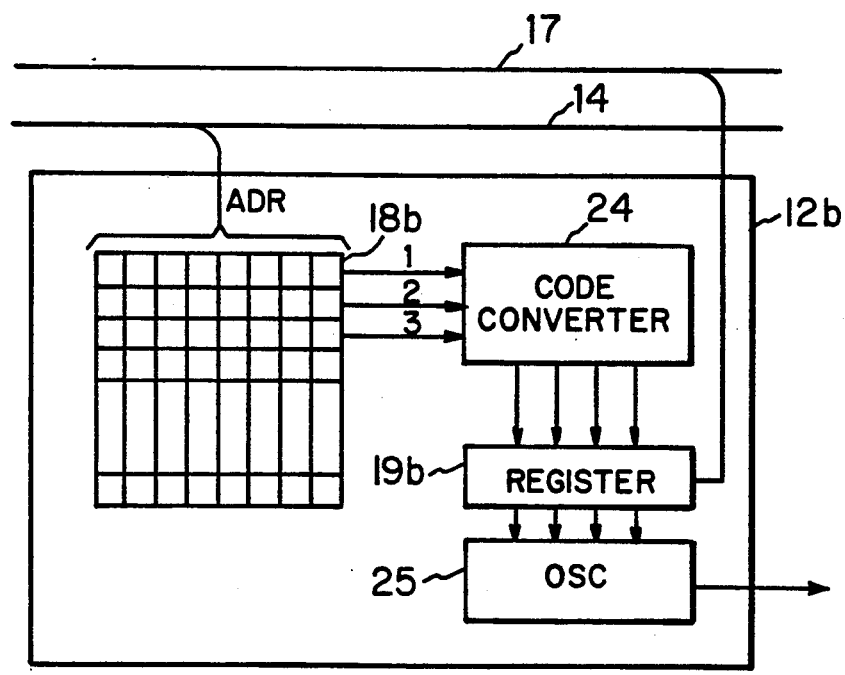
FIG. 5

REAL-TIME CONTROL SYSTEM FOR NMR SPECTROMETER

FIELD OF THE INVENTION

The present invention relates to a pulsed Fourier transform NMR spectrometer and, more particularly, to a real-time control system which controls the generation and the phase of RF pulses used in a pulsed Fourier transform NMR spectrometer.

BACKGROUND OF THE INVENTION

The prior art real-time control system for use with an NMR spectrometer is equipped with a timing control system which is called a pulse programmer or pulser. The timing control system acts to control the generation and the phase of RF pulses required for the NMR spectrometer.

FIG. 1 shows the prior art real-time control system for use with an NMR spectrometer. This control system includes a control section 1 producing m-channel control signals which are fed to functional units 2a, 2b, etc. via a pulse bus line 3. The control section 1 comprises a controller 4 and a pulser 5, and serves to control the synchronization of the whole system. The pulser 5 stores timing data items $t_1, t_2, \ldots, t_n$ for determining the timing at which the system is controlled. The pulsers also store data for controlling the system, hereinafter referred to as the control data. The control data is m-bit data indicating the condition of each channel at every instant or during every period, i.e., indicating whether it is 1 or 1. The controller 4 reads the control data from the pulser 5 according to the timing data and sends m-channel control signals to the bus line 3. The functional unit 2a receives the control signal of channel 1, for example, from the bus line 3 through a multiplexer 6, and controls a gate circuit 7 or other control means included in the NMR spectrometer.

FIG. 2(a) shows one example of the waveform of the control signal of channel 1 supplied to the gate circuit 7. A generator 8 produces an RF carrier as shown in FIG. 2(b). The RF carrier is passed through the gate circuit 7. RF pulses as shown in FIG. 2(c) appear at the output of the gate circuit 7 and are supplied to the NMR probe (not shown).

In the above-described prior art real-time control system for use with an NMR spectrometer, the control signal for enabling and disabling the gate is produced by the pulser 5 and fed via the pulse bus line 3 to the gate circuit 7 in the functional unit 2a. Therefore, if the number of the functional units 2a, 2b, etc. increases, the number of bus lines is increased. Where the number of bus lines is limited, it is only possible to connect functional units corresponding in number to the bus lines.

The gate can be enabled or disabled by one bit of data, or one control signal. Where the system is controlled in a complicated manner, as encountered when the RF frequency assumes various values, plural bits of data are needed. This necessitates the use of plural bus lines. Accordingly, in order to control the system in a more complex manner by the functional units, more bus lines are needed. If the required number of bus lines are not available, then it is inevitable that limitations are imposed on the complex control.

Moreover, the prior art system has the problem that it cannot easily synchronize various components of the system. In particular, in the conventional system, the functional units are controlled by the signals transmitted through the bus lines. Because the control signals pass through the separate lines, the time taken for each control signal to pass from the control section 1 to the functional unit differs among the lines. This problem becomes more serious when the operation speed of the system is increased. Although this problem can be addressed by designing the bus lines to transmit signals up to higher frequencies, this system entails much cost.

SUMMARY OF THE INVENTION

It is an object of the present invention to provide a real-time control system which is for use with an NMR spectrometer and which is able to flexibly cope with the addition of functional units and enables complex control.

It is another object of the invention to provide an inexpensive real-time control system which is for use with an NMR spectrometer and capable of minimizing the possibility that the synchronization is lost in the system.

These objects are achieved by a real-time control system for use with an NMR spectrometer. A central control section successively produces synchronizing signals according to stored timing data and event code data previously stored in the control section. The central control section successively produces event codes prior to the generation of the synchronization signals. An event bus includes a synchronizing control line for transmitting the synchronizing signals and an event code line for transmitting the event codes. Distributed functional units are connected with the event bus. Each distributed functional (or controlled) unit has a storage means storing the event data in association with the event codes. Each functional unit reads data from its storage means according to the event codes sent through the event code line to control the control means of the NMR spectrometer. The event data is read from the storage means and used at the timing determined by the synchronizing signals.

BRIEF DESCRIPTION OF THE DRAWINGS

FIG. 1 is a diagram of the prior art real-time control system for use with an NMR spectrometer;

FIGS. 2(a)–(c) are waveform diagrams illustrating the operation of the prior art system shown in FIG. 1;

FIGS. 4a–4f are timing diagrams illustrating the operation of the control system shown in FIG. 3;

FIG. 5 is a diagram of another real-time control system according to the invention, and in which functional units capable of varying the RF frequency are connected with a bus.

DETAILED DESCRIPTION OF THE PREFERRED EMBODIMENTS

Figure 3:
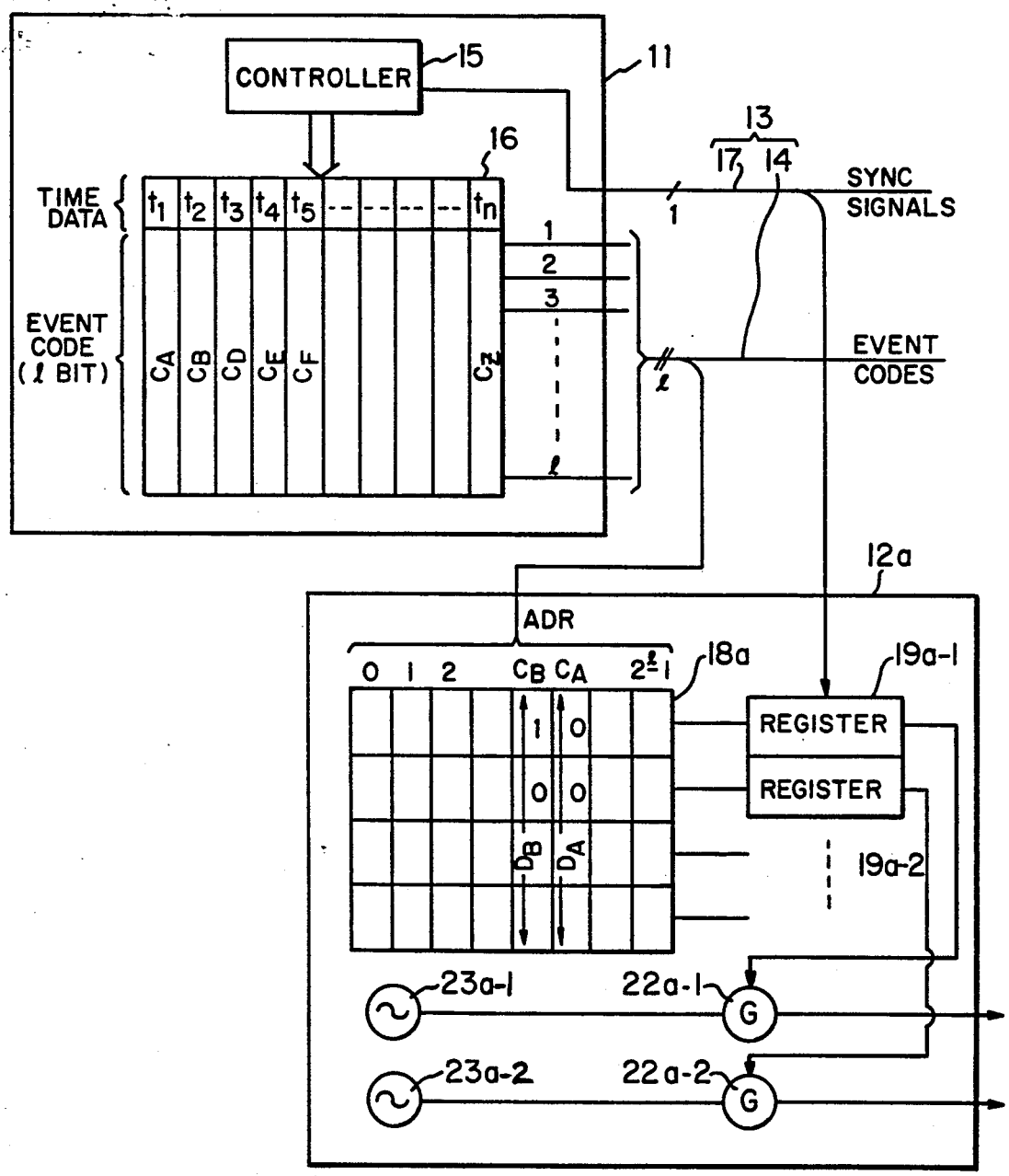
FIG. 3 is a diagram of a real-time control system according to the invention.

Referring to FIG. 3, there is shown a real-time control system according to the invention, the control system being used with an NMR spectrometer (not shown). This control system includes a central event controller 11 consisting of a controller 15 and a memory 16 storing control data. The controller 11 produces 1-bit event codes and one-bit synchronizing signals. These codes and signals are supplied to a distributed functional unit 12a via an event bus 13 consisting of an event code line 14 and a synchronizing control line 17. The control data includes timing data $(t_1, t_2, \ldots, t_n)$ determining the timing of control and data $(C_A, C_B, C_C, \ldots, C_Z)$ about event codes set at every instant of time.

The "event" means each different condition that can be assumed by the controlled NMR spectrometer. Each event code is assigned to the corresponding event to distinguish it from other events. As an example, when eight-bit event codes are used, the condition of the NMR spectrometer can be classified into $2^8$ kinds. The event data specifically represents the $2^8$ conditions of the NMR spectrometer. Each item of event data is a combination of conditions of numerous gates incorporated in the NMR spectrometer, an RF frequency, and an RF phase. One can understand that each item of m-bit (m-channel) control data stored in the pulser 5 in association with each timing data item shown in FIG. 1 corresponds to an event data item.

The distributed functional unit 12a comprises an event memory 18a, registers 19a-1, 19a-2, gate circuits 22a-1, 22a-2, oscillators 23a-1, 23a-2. Event data is read from the event memory 18a at addresses specified by the event codes. The first and second bits of the event data are simultaneously supplied to the registers 19a-1 and 19a-2, respectively, and held in these registers in synchronism with the timing signals fed to them via the synchronizing control line 17. Also, these two bits of data are sent to the gate circuits 22a-1 and 22a-2, respectively.

In the operation of this system, the controller 15 specifies addresses so that the timing data and the event codes may be successively read from the memory 16. The controller 15 then produces timing signals from the timing data $t_1, t_2, \ldots, t_n$ read out. The time intervals between the successive timing signals are $t_1, t_2, \ldots, t_n$, respectively, as shown in FIG. 4a. The timing signals are sent to the synchronizing control line 17. The controller 15 switches the address at which, data is read from the memory 16 between plural addresses after a given delay $\tau$ with respect to each timing signal. As a result, the event code which is read from the memory 16 and sent to the event code line 14 switches from $C_A$ to $C_B$ then to $C_C$ and so on and finally to $C_Z$ at the timing shown in FIG. 4b.

Event data items $D_A, D_B, D_C, \ldots, D_Z$ (FIG. 4c) are successively read from the memory 18a at addresses $C_A, C_B, C_C, \ldots, C_Z$ specified by these event codes. The first and second bits of each data item are routed to the registers 19a-1 and 19a-2, respectively. If the first bits of the event data items $D_A, D_B, D_C, D_D, D_E, D_F$ assume values 0, 1, 0, 1, 0, 0, respectively, the binary digit sent to the register 19a-1 varies as shown in FIG. 4d.

The register 19a-1 accepts the binary digits in synchronism with the timing signals shown in FIG. 4a and holds them. The output signal from the register 19a-1 takes the form shown in FIG. 4e. The gate circuit 22a-1 is enabled and disabled according to the output signal from the register 19a-1. Therefore, a pulse train consisting of two RF pulses having pulse durations $t_2$ and $t_4$, respectively, as shown in FIG. 4f, appears at the output of the gate circuit 22a-1, the interval between the RF pulses being $t_3$.

The second bits, each consisting of a binary digit, of the event data items $D_A, D_B, D_C$, etc. are supplied to the register 19a-2. This register accepts these bits of data in synchronism with the timing signals shown in FIG. 4a and holds them. The gate 22a-2 which is enabled and disabled according to the output signal from the register 19a-2 produces a pulse train corresponding to the binary digits determined by the second bits of the event data items $D_A, D_B, D_C$, etc.

Referring next to FIG. 5, there is shown another real-time control system according to the invention. In this example, a functional unit 12b capable of switching the RF frequency between eight values is connected with a bus line. The functional unit 12b comprises an event memory 18b, a code converter 24, a register 19b, and a variable frequency generator 25 producing an RF carrier based on the output from the register 19b. The code converter 24 converts three bits of event data into a code specifying the frequency. The register 19b holds the output from the converter 24.

The event memory 18b is addressed by the event codes sent to it through the event code line 14. The first through third bits of each event data item successively read from the memory 18b are sent to the code converter 24 that contains a table for converting three-bit binary data into corresponding ones of eight codes $f_0$–$f_7$ for specifying the frequency, as shown in Table 1.

TABLE 1

| data item | frequency code |
|---|---|
| 000 | $f_0$ |
| 001 | $f_1$ |
| 010 | $f_2$ |
| 011 | $f_3$ |
| 100 | $f_4$ |
| 101 | $f_5$ |
| 110 | $f_6$ |
| 111 | $f_7$ |

The converter 24 generates a frequency code specified by the three higher bits of the event data read from the memory 18b, the generated frequency code being transmitted to the register 19b. This register 19b accepts the frequency code in synchronism with the timing signals transmitted through the synchronizing control line 17. The accepted code is held in the register 19b. The variable frequency generator 25 produces an RF carrier having the frequency specified by the code held in the register 19b. Therefore, the oscillation frequency of the generator 25 can be changed at the timing determined by the timing data according to the event codes stored in the memory 16.

Figure 6:
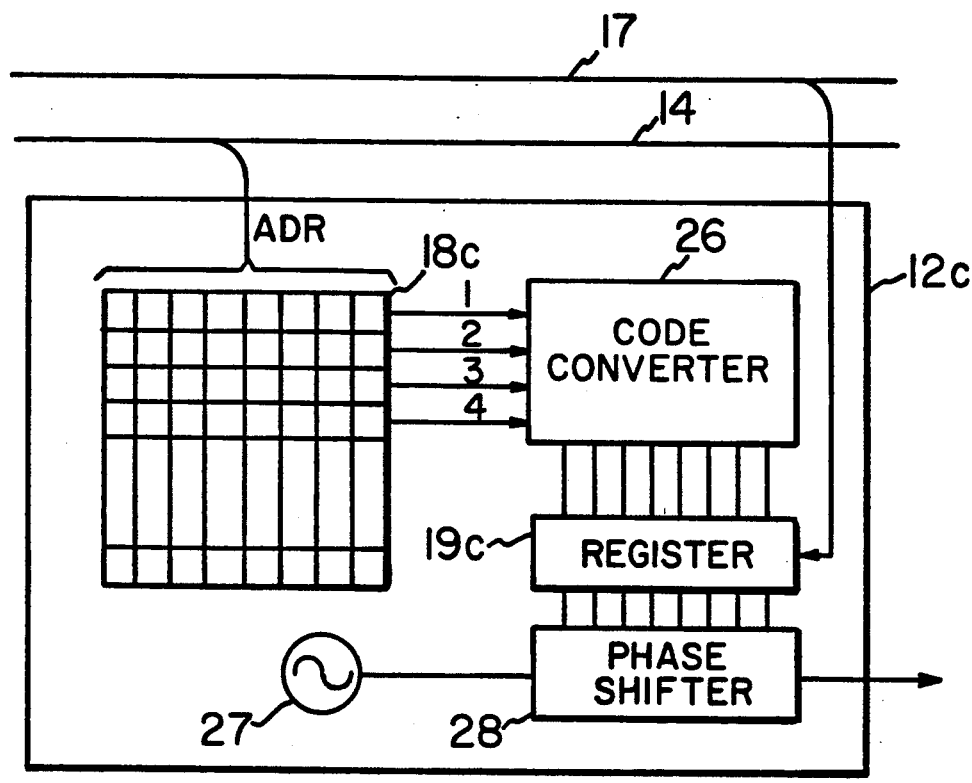
FIG. 6 is a diagram of a further real-time control system according to the invention, and in which functional units capable of varying the RF phase are connected with a bus.

Referring next to FIG. 6, there is shown a further real-time control system according to the invention. In this example, a functional unit 12c can switch the RF phase between 16 different values which successively differ by 22.5°. The functional unit 12c is connected with a bus line, and comprises an event memory 18c, a code converter 26, a register 19c holding the output from the converter, and a phase shifter 28 changing the phase of the RF carrier produced from an oscillator 27 according to the output from the register. The converter 26 converts four-bit event data into a code specifying the phase.

The event memory 18c is addressed by the event codes sent via the event code line 14. The four higher bits of each item of the event data successively read from the memory 18c are sent to the code converter 26, which has a table as shown in Table 2 for converting four-bit binary coded digits into corresponding ones of 16 codes $\theta_0$–$\theta_{15}$ specifying the phase.

TABLE 2

| data item | code specifying phase | data item | code specifying phase |
|---|---|---|---|
| 0000 | $\theta_0$ | 1000 | $\theta_8$ |
| 0001 | $\theta_1$ | 1001 | $\theta_9$ |
| 0010 | $\theta_2$ | 1010 | $\theta_{10}$ |
| 0011 | $\theta_3$ | 1011 | $\theta_{11}$ |
| 0100 | $\theta_4$ | 1100 | $\theta_{12}$ |
| 0101 | $\theta_5$ | 1101 | $\theta_{13}$ |
| 0110 | $\theta_6$ | 1110 | $\theta_{14}$ |
| 0111 | $\theta_7$ | 1111 | $\theta_{15}$ |

The code converter 26 generates a phase code specified by the 4 higher bits of each item of the event data read from the memory 18c. The generated phase codes are routed to the register 19c, which accepts the phase codes in synchronism with the timing signals sent via the synchronizing control line 17. The phase shifter 28 generates an RF carrier having a phase specified by the code held in the register 19c. Thus, the RF phase can be changed according to the event codes stored in the memory 16 at the timing determined by the timing data.

As described thus far, in accordance with the present invention, only the timing data and event code data are stored in the memory of the central event controller, which then transmits timing signals and the event codes common to all the distributed functional units through the bus line according to both timing data and event code data. Each functional unit controls the gates according to the event codes and according to the contents of the memory included in the unit, i.e., event data. Therefore, the number of gates controlled within one functional unit is determined by the data length of the memory included in the functional unit. Hence, the number of gates in each functional unit can be increased at will irrespective of the number of bus lines.

Also in the present invention, plural functional units share a bus line. This facilitates adding further functional units without increasing the number of bus lines. Moreover, all the functional units are controlled in synchronism with the timing signals transmitted through the common synchronizing control line. For this reason, the possibility that the synchronization among the distributed functional units is lost can be minimized by designing only the synchronizing control line to be capable of accommodating high-speed transmission.

It is to be noted that the invention is not limited to the above examples and that various changes and modifications may be made. In each of the above examples, only one synchronizing control line is provided. It is also possible to provide plural synchronizing control lines. The timing data and the event code data stored in the memory 16 and the event data stored in the memories 18a, 18b, 18c can be updated while the gates are being controlled.

Having thus described our invention with the detail and particularity required by the Patent Laws, what is claimed and desired to be protected by Letters Patent is set forth in the following claims.

What is claimed is:

1. A real-time control system for use with an NMR spectrometer having means for controlling the generation and phase of RF pulses and other functions in response to function control signals, said control system comprising:

a control section having means for storing timing data and event codes and a plurality of controlled sections having means for storing event data;

said control section having means for successively producing synchronizing signals according to said stored timing data and successively outputting event code data previously stored in the control section and which outputs event codes prior to the generation of each synchronizing signal;

an event bus including a single synchronizing control line for transmitting the synchronizing signals to each controlled section simultaneously and an event code bus for transmitting the event codes placed thereon by said control section to each controlled section simultaneously; and said controlled sections connected with the event bus, the event data being stored in association with event codes, each controlled section accepting each event code placed on the event code bus and reading the event data from the storage means thereof according to the event codes sent through the event code bus to all controlled sections to generate function control signals for the control of the NMR spectrometer according to the event data read from the storage means of each controlled section at the timing determined by the synchronizing signals.

* * * * *

UNITED STATES PATENT AND TRADEMARK OFFICE
CERTIFICATE OF CORRECTION

PATENT NO. : 5,206,593

DATED : April 27, 1993

INVENTOR(S) : Noriaki Kurihara, Kozo Sato, Gary L. Samuelson and Howard S. Hutchins It is certified that error appears in the above-identified patent and that said Letters Patent is hereby corrected as shown below:

Cover page, after [75] Inventors: "Noriaki." should read --Noriaki-- and
after [73] Assignee: "Jeol" should read --JEOL--.

Column 1 Line 32 "1 or 1" should read --0 or 1--.

Column 2 Line 67 "1" should read -- $\ell$ --.

Signed and Sealed this

Fourth Day of January, 1994

Attest:

BRUCE LEHMAN

*Attesting Officer*         *Commissioner of Patents and Trademarks*